(12) United States Patent
Wang

(10) Patent No.: US 8,059,394 B2
(45) Date of Patent: Nov. 15, 2011

(54) NONVOLATILE STORAGE DEVICE

(75) Inventor: Cheng-Chieh Wang, Sanchong (TW)

(73) Assignee: JW Electronics Co., Ltd., Taipei (TW)

( * ) Notice: Subject to any disclaimer, the term of this patent is extended or adjusted under 35 U.S.C. 154(b) by 210 days.

(21) Appl. No.: 12/500,227

(22) Filed: Jul. 9, 2009

(65) Prior Publication Data
US 2010/0046157 A1  Feb. 25, 2010

(30) Foreign Application Priority Data

Aug. 20, 2008 (TW) .............................. 97214923 U

(51) Int. Cl.
*G06F 1/16* (2006.01)
(52) U.S. Cl. ................................... 361/679.32
(58) Field of Classification Search .............. 361/679.32
See application file for complete search history.

(56) References Cited

U.S. PATENT DOCUMENTS

| | | | |
|---|---|---|---|
| 7,092,256 B1 * | 8/2006 | Salazar et al. ................ | 361/737 |
| 7,462,044 B1 * | 12/2008 | Regen et al. .................. | 439/131 |
| 7,524,198 B2 * | 4/2009 | Nguyen et al. ................ | 439/131 |
| 7,566,231 B2 * | 7/2009 | Regen et al. .................. | 439/131 |
| 7,628,622 B2 * | 12/2009 | Yu et al. ....................... | 439/131 |
| 7,740,494 B2 * | 6/2010 | Lin et al. ...................... | 439/131 |
| 7,771,215 B1 * | 8/2010 | Ni et al. ....................... | 439/131 |
| 2003/0229736 A1 * | 12/2003 | Shih .............................. | 710/62 |
| 2007/0292009 A1 * | 12/2007 | Nguyen et al. ................ | 382/124 |
| 2008/0280490 A1 * | 11/2008 | Nguyen et al. ................ | 439/607 |
| 2009/0042433 A1 * | 2/2009 | Bushby ........................ | 439/352 |
| 2009/0177835 A1 * | 7/2009 | Ma et al. ...................... | 711/103 |

* cited by examiner

*Primary Examiner* — Lisa Lea Edmonds
(74) *Attorney, Agent, or Firm* — C. G. Mersereau; Nikolai & Mersereau, P.A.

(57) ABSTRACT

A nonvolatile storage device includes a casing, a circuit substrate, a latch and a driving piece. The outer surface of the casing is provided with a slot. The slot is connected with a push button switch. The circuit substrate is fixed in the casing. The circuit substrate is provided with a connecting interface made according to the standard of serial advanced technology attachment, a control unit and a nonvolatile memory unit. The connecting interface protrudes outside the casing. The control unit and the connecting interface are electrically connected with the nonvolatile memory unit. One end of the latch is fixed to the outside of the connecting interface with a portion thereof suspended. The driving piece is provided in the casing. One end of the driving piece is fixed to the push button switch, and the other end of the driving piece presses the suspended portion of the latch selectively.

4 Claims, 5 Drawing Sheets

NONVOLATILE STORAGE DEVICE

BACKGROUND OF THE INVENTION

1. Field of the Invention

The present invention relates to a storage device for electronic data, and in particular, to a storage device of nonvolatile memories.

2. Description of Related Art

Hard disk is a necessary storage device for various kinds of electronic apparatuses. The rotation speed and capacity of the hard disk are increased continuously. However, when the disk and spindle of the hard disk rotate at a high speed, the vibration-damping effect of the hard disk may be reduced. Thus, the hard disk may suffer damage easily due to external impacts. Thus, in order to increase the vibration-damping effect of the storage device, a nonvolatile storage device is proposed in place of traditional hard disks.

FIG. 1 shows a conventional nonvolatile storage device 1a, which includes a casing 11a and a circuit board 12a. The circuit board 12a is fixed in the casing 11a. The circuit board 12a is electrically connected with a flash memory 121a, a control chip 122a and a connecting interface 123a. The connecting interface 123a is made according to the standard of serial advanced technology attachment. The connecting interface 123a protrudes outside the casing 11a. The exterior of the connecting interface 123a is connected to a latch 124a. The surface of the latch 124a is provided with a pair of spaced protrusions 1241a.

As shown in FIG. 2, the connecting interface 123a is inserted into a connector 2a and electrically connected thereto. The protrusions 1241a of the latch 124 protrude into corresponding openings 21a of the connector 2a to lock the connector 2a, so that the connecting interface 123a can be positioned in the connector 2a firmly.

Please refer to FIG. 3. When a user intends to remove the connecting interface 123a from the connector 2a, the user has to press the latch 124a to make the protrusions 1241a to remove from the openings 21a first. Then, the user pulls upwards the connecting interface 123a out of the connector 2a. However, during this process, the fingers of the user may be obstructed by the components near the connector 2a, which makes the user feel inconvenient in operation.

Therefore, in view of the above-mentioned drawbacks, the present Inventor proposes a reasonable and novel structure based on his expert experience and delicate researches so as to solve the drawbacks in prior art.

SUMMARY OF THE INVENTION

In view of the above problems, the objective of the present invention is to provide a nonvolatile storage device. When the user intends to remove the storage device from the connector, the fingers of the user may not be obstructed by the components near the connector, so that the user feels convenient in operation.

To achieve the above-mentioned objective, the present invention provides a nonvolatile storage device, which includes: a casing with its outer surface having a slot, the slot being connected with a push button switch; a circuit substrate fixed in the casing, the circuit substrate being electrically connected to a connecting interface, a control unit and a nonvolatile memory unit, the connecting interface protruding outside the casing, the control unit and the connecting interface being electrically connected with the nonvolatile memory unit; a latch connected to the outside of the connecting interface with a portion thereof suspended; and a driving piece provided in the casing, one end of the driving piece being fixed to the push button switch, and the other end of the driving piece selectively pressing the suspended portion of the latch.

The present invention has advantageous features as follows. Since the user needs not to press the latch directly, the user just needs to operate the push button switch to control the action of the latch. Since there is a distance between the push button switch and the connector into which the storage device is inserted, when the user intends to remove the storage device from the connector, the fingers of the user may not be obstructed by the components near the connector. Thus, a larger space can be obtained, so that the user feels convenient in operation.

DETAILED DESCRIPTION OF THE PREFERRED EMBODIMENTS

Figure 1:
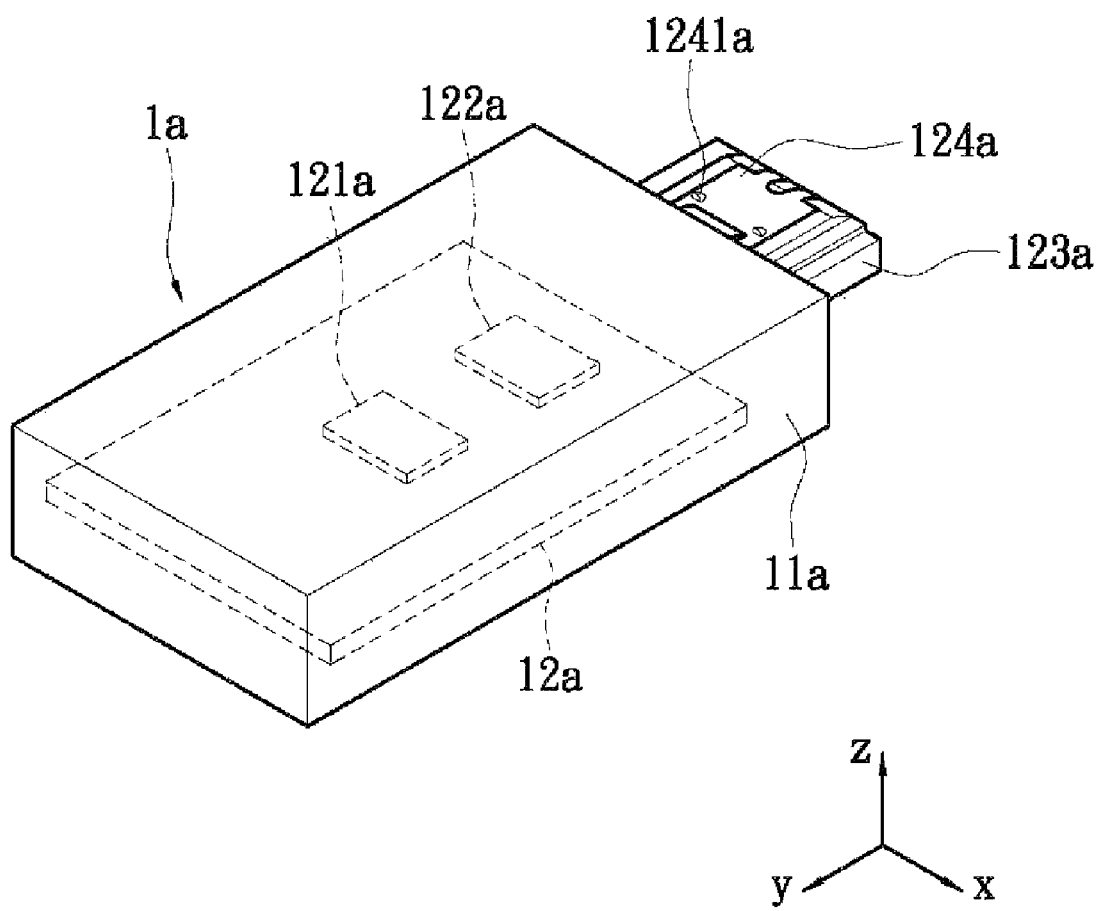
FIG. 1 is a perspective view of a conventional nonvolatile storage device.
Figure 2:
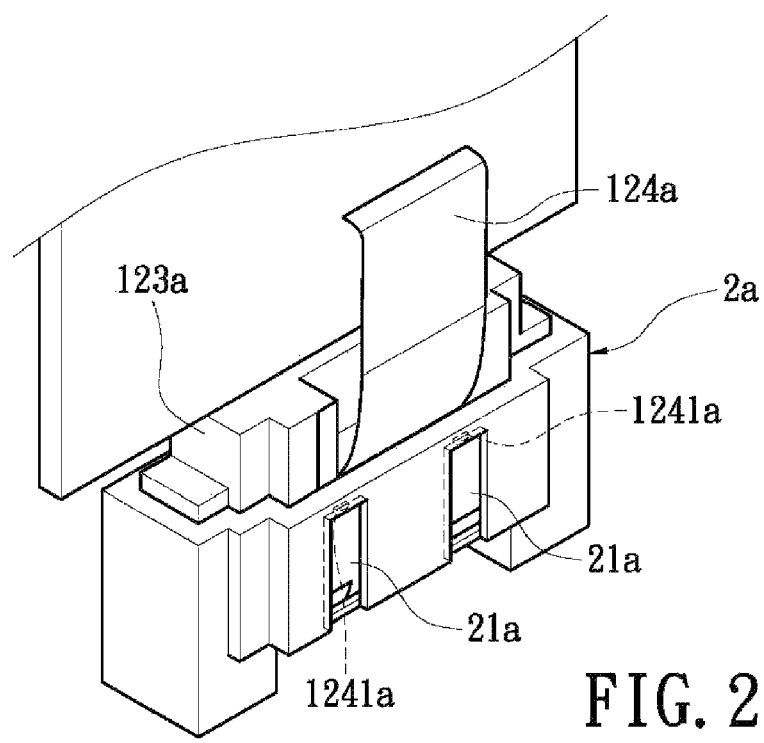
FIG. 2 is a perspective view of a conventional nonvolatile storage device with a connector locked.
Figure 3:
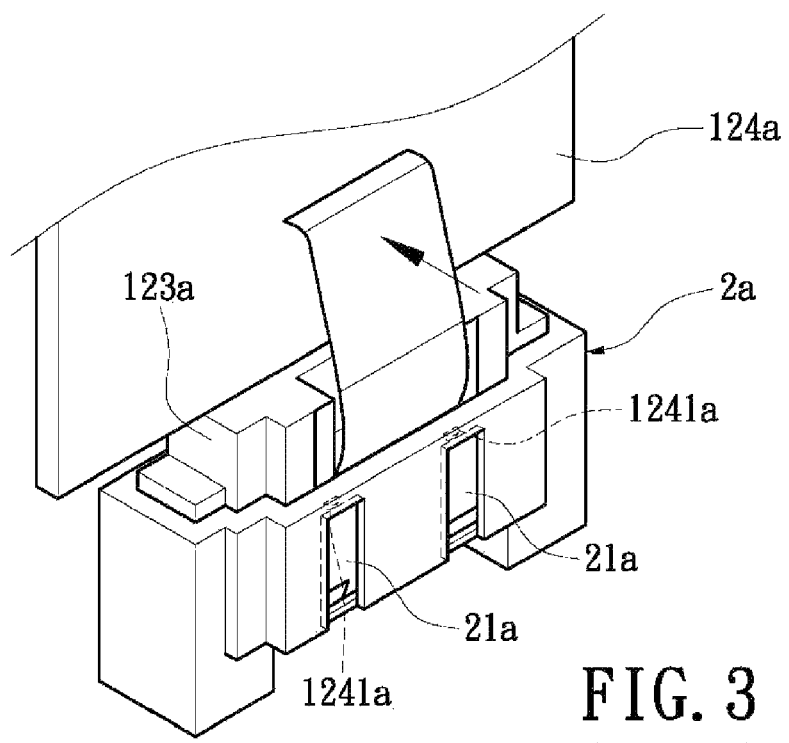
FIG. 3 is a perspective view of a conventional nonvolatile storage device with a connector removed.
Figure 4:
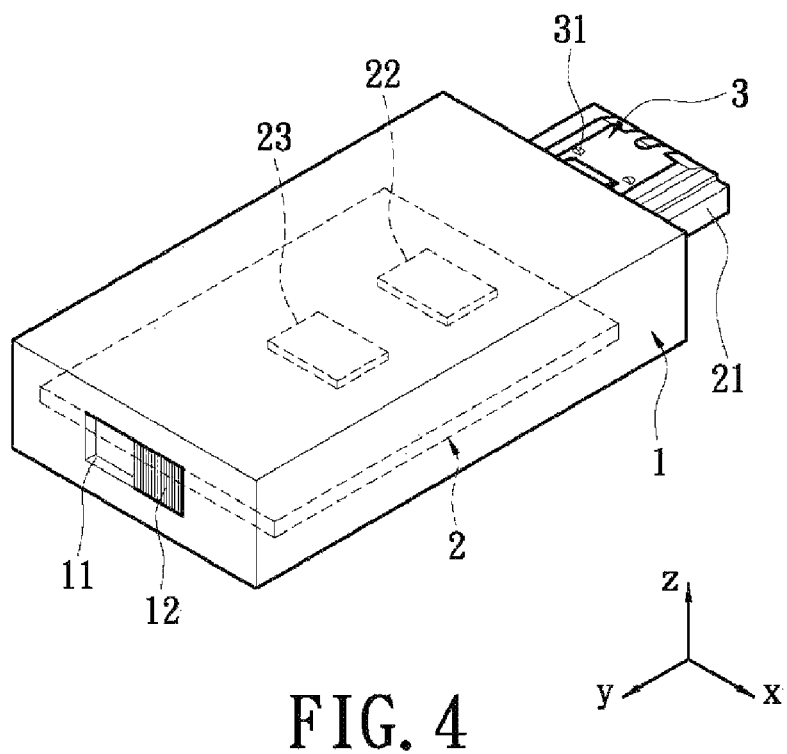
FIG. 4 is a perspective view showing the nonvolatile storage device of the present invention.
Figure 5:
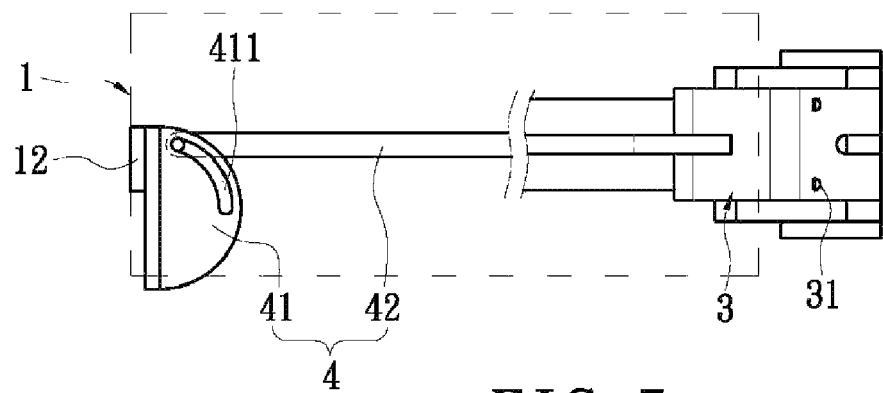
FIG. 5 is a top perspective view of FIG. 4 of the present invention.

Please refer to FIGS. 4 and 5. The present invention provides a nonvolatile storage device, which includes a casing 1, a circuit substrate 2, a latch 3 and a driving piece 4. The circuit substrate 2 is fixed in the casing 1. The circuit substrate 2 is electrically connected with a connecting interface 21, a control unit 22 and a nonvolatile memory unit 23. The connecting interface 21 is made in compliance with the standard of serial advanced technology attachment (SATA). The connecting interface 21 of the instant disclosure may be a SATA revision 1.0, SATA revision 2.0, SATA revision 3.0, eSATAp, or SATA II connector. The connecting interface 21 protrudes outside the rear end surface of the casing 1. The connecting interface 21 allows connectors to be inserted thereon. The nonvolatile memory unit 23 is constituted of single or a plurality of flash memory chips.

The control unit 22 is electrically connected with the nonvolatile memory unit 23 and the connecting interface 21. When the user inserts the connecting interface 21 of the nonvolatile storage device into the corresponding connector, via the connecting interface 21, the control unit 22 receives a writing command, reading command or erasing command from a central processor. Then, based on this writing command, reading command or erasing command, the control unit can write electronic data in the nonvolatile memory unit 23, and read or erase the electronic data from the nonvolatile memory unit 23.

One end of the latch 3 is fixed to the outside of the connecting interface 21, while a portion of the latch is suspended. There is a distance between the suspended portion of the latch 3 and the upper surface of the connecting interface 21. The upper surface of the latch 3 is provided with a pair of spaced protrusions 31. The pair of protrusions 31 is used to lock the connector, so that the connecting interface 21 can be positioned in the connector firmly.

Figure 6:
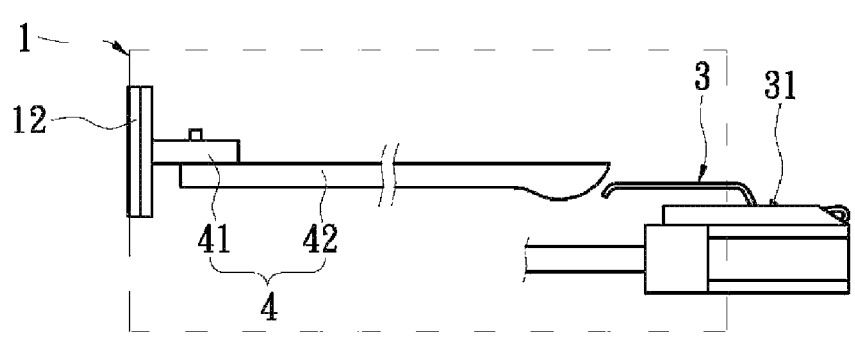
FIG. 6 is a right-side perspective view of FIG. 4 of the present invention.

Please refer to FIGS. 4 to 6. The front end surface of the casing 1 is provided with a first slot 11 along the x axis. The first slot 11 is connected with a push button switch 12. The driving piece 4 is connected within the casing 1. The driving piece 4 comprises a semi-circular base 41 and a rod 42. The base 41 is fixed to the inside surface of the push button switch 12. The upper end surface of the base 41 is provided with a second slot 411 that is curved. The rod 42 is slidingly connected into the second slot 411. The push button switch 12 is located at the left end of the first slot 11, so that one end of the rod 42 is located at the left end of the second slot 411. Since the other end of the rod 42 is separated from the latch 3 by a distance along the y axis, the rod 42 does not press on the latch 3.

Figure 7:
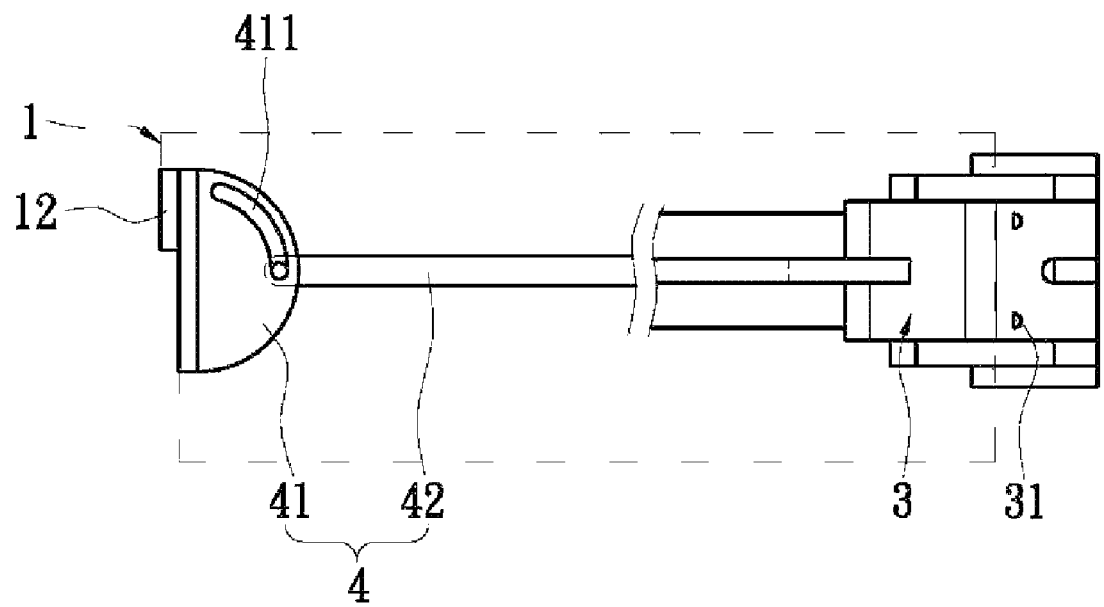
FIG. 7 is a top perspective view showing another state of the nonvolatile storage device of the present invention.
Figure 8:
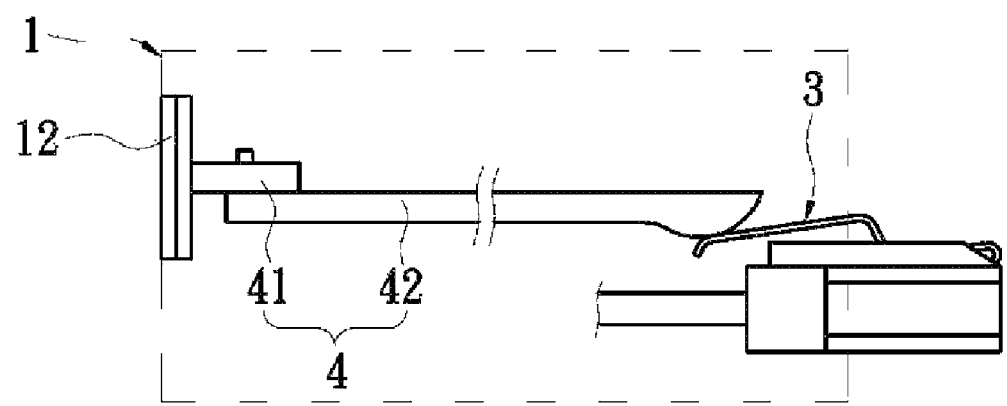
FIG. 8 is a right-side perspective view showing another state of the nonvolatile storage device of the present invention.

Please refer to FIGS. 7 and 8. If the user pushes the push button switch 12 to move along the negative x axis, the push button switch 12 will cause the base 41 to move along the negative x axis. As a result, the whole rod 42 will move along the negative y axis. One end of the rod 42 moves to the right end of the second slot 411, and the other end of the rod 42 moves along the negative y axis to press on the latch 3. Thus, the latch 3 is pressed by the rod 42 to move along the negative z axis, thereby controlling the action of the latch 3.

Figure 9:
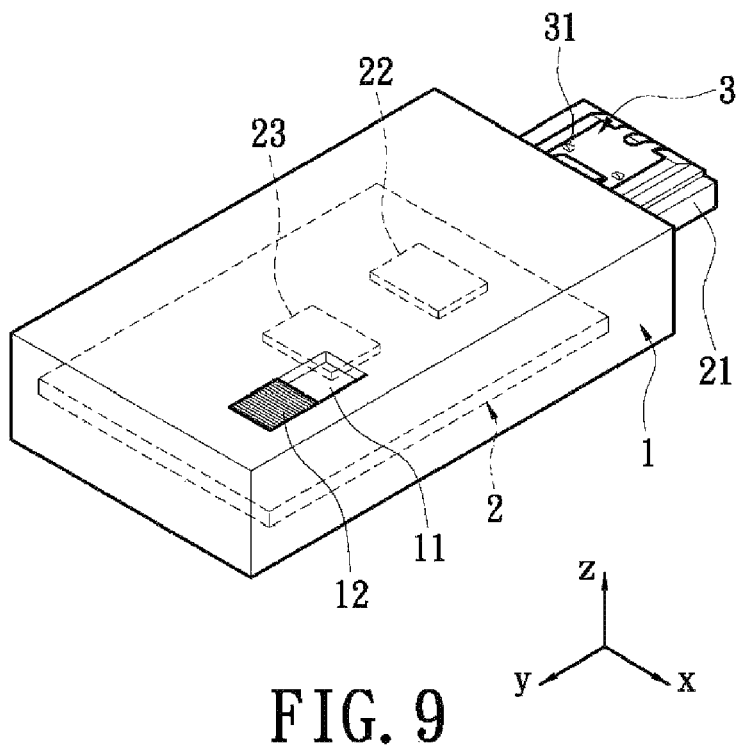
FIG. 9 is a perspective view showing the second embodiment of the nonvolatile storage device of the present invention.
Figure 10:
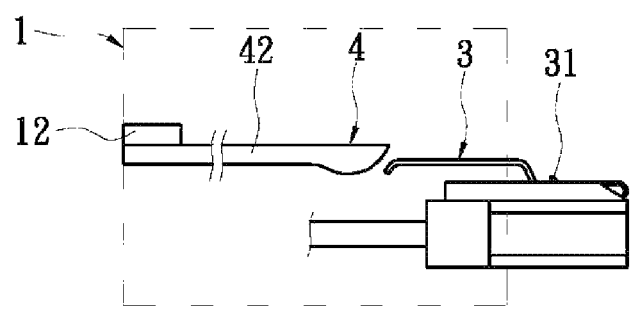
FIG. 10 is a right-side perspective view showing the second embodiment of the nonvolatile storage device of the present invention.
Figure 11:
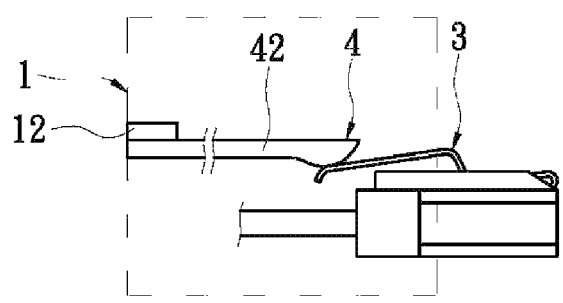
FIG. 11 is a right-side perspective view showing another state of the second embodiment of the nonvolatile storage device of the present invention.

Please refer to FIGS. 9 and 10, which show the second embodiment of the present invention. The top surface of the casing 1 is provided with a first slot 11 along the y axis. The first slot 11 is connected with the push button switch 12. The base 41 of the driving piece 4 is omitted, and only the rod 42 is left. One end of the rod 42 is fixed to the inside surface of the push button switch 12, while the other end of the rod 42 is separated from the latch 3 by a distance along the y axis. Thus, the rod 42 does not press on the latch 3. Please refer to FIG. 11. When the user pushes the push button switch 12 to move along the negative y axis, the push button switch 12 drives the rod 42 to move along the negative y axis, so that the rod 42 can press on the latch 3. The latch 3 is pressed by the rod 42 to move along the negative z axis, thereby controlling the action of the latch 3.

According to the nonvolatile storage device of the present invention, the user needs not to press the latch 3 on the connecting interface 2 directly. The user only needs to operate the push button switch 11 so as to control the action of the latch 3. Since there is a distance between the push button switch 11 and the connector in which the storage device is inserted, if the user intends to remove the storage device from the connector, the fingers of the user may not be obstructed by the components near the connector. Thus, a larger space can be obtained, so that the user can feel convenient in operation.

The above-mentioned descriptions represent merely the preferred embodiments of the present invention, without any intention to limit the scope of the present invention thereto. Various equivalent changes, alternations or modifications based on the claims of present invention are all consequently viewed as being embraced by the scope of the present invention.

What is claimed is:

1. A nonvolatile storage device comprising:
    a casing with its outer surface having a first slot, the first slot being connected with a push button switch;
    a circuit substrate fixed in the casing, the circuit substrate being electrically connected with a connecting interface, a control unit and a nonvolatile unit, the connecting interface protruding outside the casing, the control unit and the connecting interface being electrically connected with the nonvolatile memory unit;
    a latch connected to the outside of the connecting interface with a portion thereof suspended; and
    a driving piece provided in the casing, one end of the driving piece being fixed to the push button switch, and the other end of the driving piece pressing the suspended portion of the latch selectively.

2. The nonvolatile storage device according to claim 1, wherein the first slot is provided on the front end surface of the casing, the driving piece comprises a base and a rod, the base is fixed to the inside surface of the push button switch, the base is provided with a second slot, one end of the rod is slidingly connected in the second slot, and the other end of the rod presses the suspended portion of the latch selectively.

3. The nonvolatile storage device according to claim 1, wherein the first slot is provided on the top surface of the casing, the driving piece is a rod, one end of the rod is fixed to the inside surface of the push button switch, and the other end of the rod presses the suspended portion of the latch selectively.

4. The nonvolatile storage device according to claim 1, wherein the surface of the latch is provided with a pair of spaced protrusions.

* * * * *